US008502347B1

(12) United States Patent
Hekmatshoartabari et al.

(10) Patent No.: US 8,502,347 B1
(45) Date of Patent: Aug. 6, 2013

(54) BIPOLAR JUNCTION TRANSISTOR WITH EPITAXIAL CONTACTS

(75) Inventors: Bahman Hekmatshoartabari, White Plains, NY (US); Tak H. Ning, Yorktown Heights, NY (US); Devendra K. Sadana, Pleasantville, NY (US); Ghavam G. Shahidi, Round Ridge, NY (US); Davood Shahrjerdi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/532,323

(22) Filed: Jun. 25, 2012

Related U.S. Application Data

(63) Continuation of application No. 13/481,048, filed on May 25, 2012.

(51) Int. Cl.
*H01L 21/02* (2006.01)

(52) U.S. Cl.
USPC ........... 257/586; 257/532; 257/565; 257/579; 257/583; 257/588; 438/315; 438/322; 438/332; 438/357; 438/366

(58) Field of Classification Search
None
See application file for complete search history.

(56) References Cited

U.S. PATENT DOCUMENTS

| 4,978,630 | A | * | 12/1990 | Kim | ............................. 438/327 |
| 5,108,936 | A | | 4/1992 | Ghannam et al. | |
| 5,581,114 | A | | 12/1996 | Bashir et al. | |
| 5,583,726 | A | | 12/1996 | Mizoshita et al. | |
| 5,736,447 | A | | 4/1998 | Choi et al. | |
| 6,309,938 | B1 | | 10/2001 | Kizilyalli | |

OTHER PUBLICATIONS

Pengpad P., et al., "Double-polysilicon self-aligned lateral bipolar transistors", J Mater Sci: Mater Electron (2008) 19:183-187.
Zhao, F., et al., "First Demonstration of 4H-SiC RF Bipolar Junction Transistors on a Semi-insulating Substrate with fT/fMAX of 7/5.2 GHz", Microwave Symposium Digest, 2005 IEEE MTT-S International Date of Conference: Jun. 12-17, 2005, Adv. Power Technol., Moulder Adv. Technol. Center, Boulder, CO, USA.
Della Corte, F. G., "Design and simulation of an a-Si:H/GaAs Heterojunction Bipolar Transistor",VLSI Circuits and Systems, Proceedings of the SPIE, Aug. 2003, vol. 5117, pp. 547-556.
Sharma, S., et al., "High-Voltage 4H-SiC Bipolar Junction Transistors With Epitaxial Regrowth of the Base Contact", IEEE Transactions on Electron Devices, Dec. 2008, Vol. 55, No. 12.

(Continued)

*Primary Examiner* — Kyoung Lee
(74) *Attorney, Agent, or Firm* — Scully, Scott, Murphy & Presser, P.C.; Louis J. Percello, Esq.

(57) ABSTRACT

Bipolar junction transistors are provided in which at least one of an emitter contact, a base contact, or a collector contact thereof is formed by epitaxially growing a doped $Si_xGe_{1-x}$ layer, wherein x is $0 \leq x \leq 1$, at a temperature of less than 500° C. The doped $Si_xGe_{1-x}$ layer comprises crystalline portions located on exposed surfaces of a crystalline semiconductor substrate and non-crystalline portions that are located on exposed surfaces of a passivation layer which can be formed and patterned on the crystalline semiconductor substrate. The doped $Si_xGe_{1-x}$ layer of the present disclosure, including the non-crystalline and crystalline portions, contains from 5 atomic percent to 40 atomic percent hydrogen.

21 Claims, 5 Drawing Sheets

OTHER PUBLICATIONS

Balachandran, S. et al., "4kV 4H-SiC Epitaxial Emitter Bipolar Junction Transistors", Proceedings of the 17th International Symposium on Power Semiconductor Devices & IC's May 23-26, 2005, Santa Barbara, CA.

Ghannam, M., et al., "A Silicon Bipolar Transistor With a Hydrogenated Amorphous Emitter", Electron Devices Meeting, Date of Conference: Dec. 9-12, 1984, vol. 30, pp. 746-748.

Della Corte, F. G., et al., "Design of a-Si:H/GaAs heterojunction bipolar transistors with improved DC and AC characteristics", IEE Proc.-Circuits Devices Syst., Aug. 2003, vol. 150, No. 4.

Della Corte, F. G., et al., "Design of an a-Si:H(n)/GaAs(p)/GaAs(n) high-gain heterojunction bipolar transistor with 10 GHz cut-off frequency", Journal of Non-Crystalline Solids, 299-302, Apr. 2002, pp. 1365-1369.

Bashir, R., et al., "A Polysilicon Contacted Subcollector BJT for a Three-Dimensional BiCMOS Process", IEEE Electron Device Letters, Aug. 1992, vol. 13, No. 8.

U.S. Appl. No. 13/032,826, entitled, "Silicon Photovoltaic Element and Fabrication Method", filed on Feb. 23, 2011, first named inventor: Bahman Hekmatshoar-Tabari.

U.S. Appl. No. 13/032,866, entitled, "Low-Temperature Selective Epitaxial Growth of Silicon for Device Integration", filed on Feb. 23, 2011, first named inventor: Bahman Hekmatshoar-Tabari.

Balachandran, S. et al., "4kV 4H-SiC Epitaxial Emitter Bipolar Junction Transistors", IEEE Electron Devices Letters, Jul. 2005, vol. 26, No. 7.

* cited by examiner

BIPOLAR JUNCTION TRANSISTOR WITH EPITAXIAL CONTACTS

CROSS REFERENCE TO RELATED APPLICATION

This application is a continuation of U.S. patent application Ser. No. 13/481,048, filed May 25, 2012 the entire content and disclosure of which is incorporated herein by reference.

BACKGROUND

The present disclosure relates to semiconductor structures and methods of fabricating the same. More particularly, the present disclosure relates to bipolar junction transistors with epitaxial semiconductor contacts and methods of forming the same.

A bipolar junction transistor (BJT) is a three-terminal electronic device constructed of doped semiconductor materials, which may be used in amplifying or switching applications. The operation of bipolar junction transistors includes both electrons and holes. Charge flow in a BJT is due to bidirectional diffusion of charge carriers across a junction between two regions of different charge concentrations. The mode of operation of a BJT is contrasted with unipolar transistors, such as field effect transistors, in which only one carrier type is involved in charge flow due to drift. By design, most of the BJT collector current is due to the flow of charges injected from a high-concentration emitter into the base where there are minority carriers that diffuse toward the collector.

Conventional epitaxial semiconductor growth of the doped regions of a BJT typically requires high temperatures (generally greater than 600° C.). Depending on the application, the high epitaxial growth temperature may have any or all of the following drawbacks, degradation of minority carrier lifetime, creation of structural defects, undesired impurity diffusion resulting in junction widening, relaxation of stain or generation of undesirable strain resulting in buckling or delamination.

SUMMARY

Bipolar junction transistors are provided in which at least one of an emitter contact, a base contact, or a collector contact is formed by epitaxially growing a doped $Si_xGe_{1-x}$ layer, wherein x is $0 \leq x \leq 1$, at a temperature of less than 500° C. The doped $Si_xGe_{1-x}$ layer comprises crystalline portions located on exposed surfaces of a crystalline semiconductor substrate and non-crystalline portions that are located on exposed surfaces of a passivation layer which can be formed and patterned on the crystalline semiconductor substrate. The doped $Si_xGe_{1-x}$ layer of the present disclosure, including the non-crystalline and crystalline portions, contains from 5 atomic percent to 40 atomic percent hydrogen. Since hydrogen is present in the doped $Si_xGe_{1-x}$ layer including the crystalline and non-crystalline portions, the $Si_xGe_{1-x}$ layer may be referred as a hydrogenated and doped $Si_xGe_{1-x}$ layer.

In one embodiment of the present disclosure, a method of forming a bipolar junction transistor is provided. The method of the present disclosure includes forming at least one of an emitter contact, a base contact, or a collector contact on a surface of a crystalline semiconductor substrate by epitaxially growing a doped $Si_xGe_{1-x}$ layer, wherein x is $0 \leq x \leq 1$, at a temperature of less than 500° C. utilizing a gas mixture of a source gas, hydrogen, and a dopant gas, wherein the source gas comprises at least one of a Si-containing precursor, a Ge-containing precursor or a mixture thereof.

In another embodiment of the present disclosure, a selective method of forming a bipolar junction transistor is provided. The selective method includes forming a passivation layer on a surface of a crystalline semiconductor substrate of a first conductivity type. Next, the passivation layer is patterned to include at least one opening which exposes at least one portion of the surface of the crystalline semiconductor substrate. A doped $Si_xGe_{1-x}$ layer wherein x is $0 \leq x \leq 1$ is then epitaxially grown at a temperature of less than 500° C. In accordance with the present disclosure, the doped $Si_xGe_{1-x}$ layer comprises a non-crystalline doped $Si_xGe_{1-x}$ portion located on an exposed surface of the passivation layer, and a crystalline doped $Si_xGe_{1-x}$ portion located on the exposed at least one portion of the surface of the crystalline semiconductor substrate. The non-crystalline doped $Si_xGe_{1-x}$ portion is then removed selective to the crystalline doped $Si_xGe_{1-x}$ portion, and thereafter an electrode is formed on the exposed surface of the crystalline doped $Si_xGe_{1-x}$ portion.

In a further embodiment, a non-selective method of forming a bipolar junction transistor is provided. The non-selective method includes forming a passivation layer on a surface of a crystalline semiconductor substrate of a first conductivity type. Next, the passivation layer is patterned to include at least one opening which exposes at least one portion of the surface of the crystalline semiconductor substrate. A doped $Si_xGe_{1-x}$ layer wherein x is $0 \leq x \leq 1$ is then epitaxially grown at a temperature of less than 500° C. In accordance with the present disclosure, the doped $Si_xGe_{1-x}$ layer comprises a non-crystalline doped $Si_xGe_{1-x}$ portion located on an exposed surface of the passivation layer, and a crystalline doped $Si_xGe_{1-x}$ portion located on the exposed at least one portion of the surface of the crystalline semiconductor substrate. A mask is then formed on an exposed surface of the crystalline doped $Si_xGe_{1-x}$ portion and an adjoining end segment of the non-crystalline doped $Si_xGe_{1-x}$ portion. Next, a remaining portion of the non-crystalline doped $Si_xGe_{1-x}$ portion not protected by the mask is removed.

In a yet other embodiment of the present disclosure, a bipolar junction transistor is provided. In this embodiment, the bipolar junction transistor includes a crystalline semiconductor substrate of a first conductivity type. An emitter contact of a second conductivity type opposite to the first conductivity type is located on a first surface portion of the crystalline semiconductor substrate. A collector contact of the second conductivity type is located on a second surface portion of the crystalline semiconductor substrate. A base contact of the first conductivity type is located on a third surface portion of the crystalline semiconductor substrate. The bipolar junction transistor further includes a first electrode located on an exposed surface of the emitter contact, a second electrode located on an exposed surface of the collector contact, and a third electrode located on an exposed surface of the base contact. In accordance with the present disclosure at least one of the emitter contact, the collector contact and the base contact comprises a crystalline doped $Si_xGe_{1-x}$ material containing from 5 atomic % to 40 atomic % hydrogen, wherein x is $0 \leq x \leq 1$.

In still another embodiment of the present disclosure, a bipolar junction transistor is provided utilizing a bulk semiconductor substrate. In this embodiment of the present disclosure, the bipolar junction transistor includes a crystalline semiconductor substrate of a first conductivity type and having a first surface and a second surface that is opposite to the first surface. A passivation layer having an emitter contact opening and a collector contact opening is located on the first surface. An emitter contact is located within the emitter contact opening and comprises a first crystalline doped $Si_xGe_{1-x}$ material of a second conductivity type and containing from 5 atomic % to 40 atomic % hydrogen, wherein x is $0 \leq x \leq 1$ and the second conductivity type is different from the first conductivity type. A collector contact is located within the collector contact opening and comprises a second crystalline doped $Si_xGe_{1-x}$ material of the second conductivity type and containing from 5 atomic % to 40 atomic % hydrogen, wherein x is $0 \leq x \leq 1$. A base contact of the first conductivity type is located on the second surface of the crystalline semiconductor substrate. The bipolar junction transistor further includes a first electrode located on an exposed surface of the emitter contact, a second electrode located on an exposed surface of the collector contact, and a third electrode located on an exposed surface of the base contact.

In an even further embodiment of the present disclosure, a bipolar junction transistor is provided utilizing a semiconductor-on-insulator substrate. The bipolar junction transistor includes a semiconductor substrate comprising a handle substrate, a buried insulating layer, and a crystalline top semiconductor layer, wherein the crystalline top semiconductor layer is of a first conductivity type and comprises an III-V compound semiconductor or a semiconductor material having the formula $Si_yGe_{1-y}$ wherein y is $0 \leq y \leq 1$. A passivation layer having an emitter contact opening, a collector contact opening and a base contact opening is located on a surface of the crystalline top semiconductor layer. An emitter contact is located within the emitter contact opening and comprises a first crystalline doped $Si_xGe_{1-x}$ material of a second conductivity type and containing from 5 atomic % to 40 atomic % hydrogen, wherein x is $0 \leq x \leq 1$ and the second conductivity type is different from the first conductivity type. A collector contact is located within the collector contact opening and comprises a second crystalline doped $Si_xGe_{1-x}$ material of the second conductivity type and containing from 5 atomic % to 40 atomic % hydrogen, wherein x is $0 \leq x \leq 1$. A base contact is located within the base contact opening and comprises a third crystalline doped $Si_xGe_{1-x}$ material of the first conductivity type and containing from 5 atomic % to 40 atomic % hydrogen, wherein x is $0 \leq x \leq 1$. The bipolar junction transistor also includes a first electrode located on an exposed surface of the emitter contact, a second electrode located on an exposed surface of the collector contact and a third electrode located on an exposed surface of the base contact.

DETAILED DESCRIPTION

Figure 1:
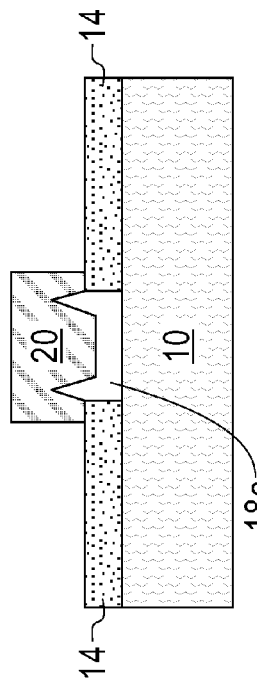
FIG. 1 is a pictorial representation (through a cross sectional view) depicting a structure including a passivation layer located atop a crystalline semiconductor substrate that can be employed in one embodiment of the present disclosure.

The present disclosure, which provides bipolar junction transistors with epitaxially grown semiconductor material contacts, and methods of forming the same, will now be described in greater detail by referring to the following discussion and drawings that accompany the present application. It is noted that the drawings of the present application are provided for illustrative purposes and, as such, they are not drawn to scale. In the drawings and the description that follows, like elements are referred to by like reference numerals. For purposes of the description hereinafter, the terms "upper", "lower", "right", "left", "vertical", "horizontal", "top", "bottom", and derivatives thereof shall relate to the components, layers and/or elements as oriented in the drawing figures which accompany the present application.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

As stated above, the present disclosure provides bipolar junction transistors in which at least one of an emitter contact, a base contact, or a collector contact is formed by epitaxially growing a doped $Si_xGe_{1-x}$ layer, wherein x is $0 \leq x \leq 1$, at a temperature of less than 500° C. The doped $Si_xGe_{1-x}$ layer comprises crystalline portions located on exposed surfaces of a crystalline semiconductor substrate and non-crystalline portions that are located on exposed surfaces of a passivation layer which can be formed and patterned on the crystalline semiconductor substrate. In embodiments in which no passivation layer is present, a crystalline doped $Si_xGe_{1-x}$ layer can be formed entirely across an exposed surface of the crystalline semiconductor substrate. The doped $Si_xGe_{1-x}$ layer of the present disclosure, including the non-crystalline and crystalline portions, contains from 5 atomic percent to 40 atomic percent hydrogen. Since hydrogen is present in the doped $Si_xGe_{1-x}$ layer including the crystalline and non-crystalline portions the $Si_xGe_{1-x}$ layer may be referred as a hydrogenated and doped $Si_xGe_{1-x}$ layer.

Reference is now made to FIGS. 1-5 which illustrate a selective method of forming a bipolar junction transistor of the present disclosure. In the selective method, a patterned passivation layer is formed on an exposed surface of a crystalline semiconductor substrate. Next, a doped $Si_xGe_{1-x}$ layer wherein x is $0 \leq x \leq 1$ is epitaxially grown at a temperature of less than 500° C. Crystalline portions of the doped $Si_xGe_{1-x}$ layer are located on exposed surfaces of the crystalline semiconductor substrate and non-crystalline portions of the doped $Si_xGe_{1-x}$ layer are located on exposed surfaces of the passivation layer. The non-crystalline portions of the doped $Si_xGe_{1-x}$ layer are then removed selective to the crystalline portions of the doped $Si_xGe_{1-x}$ layer. Next, an electrode is formed on an exposed surface of each crystalline portion of the doped $Si_xGe_{1-x}$ layer.

Referring first to FIG. 1, there is illustrated a structure including a passivation layer 14 located on a surface of a crystalline semiconductor substrate 10 that can be employed in one embodiment of the present disclosure. The term "crystalline" is used herein to denote a single crystal material, a multi-crystalline material or a polycrystalline material. Typically, the crystalline semiconductor substrate 10 is comprised of a single crystalline semiconductor material. The term "non-crystalline" is used herein to denote an amorphous, nano-crystalline or micro-crystalline material.

In one embodiment, the crystalline semiconductor substrate 10 that can be employed in the present disclosure can be an III-V compound semiconductor which includes at least one element from IIIA (i.e., Group 13) of the Periodic Table of Elements and at least one element from Group VA (i.e., Group 15) of the Periodic Table of Elements. The range of possible formulae for suitable III-V compound semiconductors that can be used in the present disclosure is quite broad because these elements can form binary (two elements, e.g., gallium(III) arsenide (GaAs)), ternary (three elements, e.g., indium gallium arsenide (InGaAs)) and quaternary (four elements, e.g., aluminium gallium indium phosphide(AlInGaP)) alloys.

In another embodiment of the present disclosure, the crystalline semiconductor substrate 10 can be a semiconductor material having the formula $Si_yGe_{1-y}$ wherein y is $0 \leq y \leq 1$. In some embodiments, in which y is 1, the semiconductor substrate 10 can be comprised entirely of Si. In another embodiment, in which y is 0, the semiconductor substrate 10 can be comprised entirely of Ge. In yet another embodiment and when y is other than 0 or 1, the crystalline semiconductor substrate 10 can be comprised entirely of a SiGe alloy.

The crystalline semiconductor substrate 10 can be a bulk semiconductor material or it can be a semiconductor-on-insulator material which includes, from bottom to top, a handle substrate, a buried insulating layer, and a top semiconductor layer which is typically crystalline and is composed of either an III-V compound semiconductor, or a semiconductor material having the formula $Si_yGe_{1-y}$ wherein y is $0 \leq y \leq 1$. The handle substrate can be comprised of a same or different semiconductor material as the top semiconductor layer, while the buried insulating layer may be comprised of a semiconductor oxide, semiconductor nitride, semiconductor oxynitride or a multilayered stack thereof. The semiconductor-on-insulator substrate that can be employed in some embodiments of the present disclosure can be formed by ion implantation and annealing, or the semiconductor-on-insulator substrate can be formed utilizing a layered transfer process. The thickness of each of the layers forming the semiconductor-on-insulator substrate is within ranges that are typically used for fabricating semiconductor structures.

The crystalline semiconductor substrate 10, or the top crystalline semiconductor layer of a semiconductor-on-insulator substrate, is of a first conductivity type which is either p-type or n-type. As used herein, "p-type" refers to the addition of impurities to an intrinsic semiconductor that creates deficiencies of valence electrons (i.e., holes). In a Si-containing semiconductor material, examples of p-type dopants, i.e., impurities, include but are not limited to, boron, aluminum, gallium and indium. In one embodiment, in which the first conductivity type of the semiconductor material of the crystalline semiconductor substrate 10 or the top crystalline semiconductor layer of a semiconductor-on-insulator substrate is p-type, the p-type dopant is present in a concentration ranging from $1 \times 10^9$ atoms/cm$^3$ to $1 \times 10^{20}$ atoms/cm$^3$. In another embodiment, in which the first conductivity type is p-type, the p-type dopant is present in a concentration ranging from $1 \times 10^{14}$ atoms/cm$^3$ to $1 \times 10^{19}$ atoms/cm$^3$. As used herein, "n-type" refers to the addition of impurities that contributes free electrons to an intrinsic semiconductor. In a Si-containing semiconductor, examples of n-type dopants, i.e., impurities, include but are not limited to, antimony, arsenic and phosphorous. In one embodiment, in which the first conductivity type of the semiconductor material of the crystalline semiconductor substrate 10 or the top crystalline semiconductor layer of a semiconductor-on-insulator substrate is n-type, the n-type dopant is present in a concentration ranging from $1 \times 10^9$ atoms/cm$^3$ to $1 \times 10^{20}$ atoms/cm$^3$. In another embodiment, in which the first conductivity type is n-type, the n-type dopant is present in a concentration ranging from $1 \times 10^{14}$ atoms/cm$^3$ to $1 \times 10^{19}$.

The dopant concentration that provides the first conductivity type may be graded or uniform. By "uniform" it is meant that the dopant concentration is the same throughout the entire thickness of a semiconductor material that provides the crystalline semiconductor substrate 10 or the top crystalline semiconductor layer of a semiconductor-on-insulator substrate. For example, a crystalline semiconductor substrate 10 or the top crystalline semiconductor layer of a semiconductor-on-insulator substrate having a uniform dopant concentration may have the same dopant concentration at the upper surface and bottom surface of the semiconductor material that provides the crystalline semiconductor substrate 10 or the top crystalline semiconductor layer of a semiconductor-on-insulator substrate, as well as the same dopant concentration at a central portion of the semiconductor material between the upper surface and the bottom surface of the crystalline semiconductor substrate 10 or the top crystalline semiconductor layer of a semiconductor-on-insulator substrate. By "graded" it is meant that the dopant concentration varies throughout the thickness of the crystalline semiconductor substrate 10 or the top crystalline semiconductor layer of a semiconductor-on-insulator substrate. For example, a crystalline semiconductor substrate 10 or the top crystalline semiconductor layer of a semiconductor-on-insulator substrate having a graded dopant concentration may have an upper surface with a greater dopant concentration than the bottom surface of the crystalline semiconductor substrate 10 or the top crystalline semiconductor layer of a semiconductor-on-insulator substrate, and vice versa.

The first conductivity type can be introduced during the growth of the crystalline semiconductor material. Alternatively, the first conductivity type can be introduced into an intrinsic semiconductor material by utilizing ion implantation, and/or gas phase doping.

Next, a passivation layer 14 is provided on an exposed surface of the crystalline semiconductor substrate 10. The exposed surface can be a front side surface, a back side surface or on both a front side surface and a back side surface of the crystalline semiconductor substrate 10. In the drawings, the passivation layer 14 is shown on a front side surface, e.g., first surface, of the crystalline semiconductor substrate 10, while the back side surface, e.g., second surface which is opposite to the first surface, is bare. In some embodiments, the back side surface of the crystalline semiconductor substrate 10 can be processed to include other components of the bipolar junction transistor, e.g., a base contact and its associated electrode already formed thereon.

Notwithstanding the location of the passivation layer 14, the passivation layer 14 serves as a passivation layer to saturate dangling bonds on the surface of the crystalline semiconductor substrate 10, in order to reduce the recombination of carriers at the surface of the crystalline semiconductor substrate 10. The passivation layer 14 may also reduce the recombination of carriers at the surface of the crystalline semiconductor substrate 10 by "field-induced" passivation, for example by repelling the minority carriers from the surface of the crystalline semiconductor substrate 10. Field-induced passivation may be facilitated by the presence of fixed electronic charges in the passivation layer, formation of dipoles at the passivation/substrate interface, or the electric field induced by the workfunction difference between the passivation layer and the substrate semiconductor material. The passivation layer 14 may also serve to prevent air or moisture from being introduced into the crystalline semiconductor substrate 10. The passivation layer 14 that can be employed in the present disclosure includes, for example, a hard mask material such as, for example, a semiconductor oxide, a semiconductor nitride, a semiconductor oxynitride, or a multilayered stack thereof. The passivation layer 14 may also be comprised of a high-k dielectric (k>silicon oxide) such as aluminum oxide or hafnium oxide. In some embodiments, which is more typical to III-V materials, the passivation layer 14 may be comprised of a substantially undoped semiconductor material having a larger bandgap than that of the crystalline semiconductor substrate 10 to passivate the surface of the crystalline semiconductor substrate 10 by repelling the minority carriers induced by workfunction difference between the semiconductor materials formed by the passivation layer 14 and the crystalline semiconductor substrate 10. In other embodiments, the passivation layer 14 is comprised of silicon oxide, silicon nitride, and/or silicon oxynitride. The passivation layer 14 can have a thickness from 5 nm to 50 nm. Other thicknesses that are below or above the aforementioned thickness range can also be employed.

In one embodiment, the passivation layer 14 can be formed by a deposition process including, for example, chemical vapor deposition, plasma enhanced chemical vapor deposition, atomic layer deposition or chemical solution. In other embodiments, the passivation layer 14 can be formed utilizing a thermal technique such as, for example, oxidation and/or nitridation. In yet other embodiments, a combination of a deposition process and a thermal technique can be used to form the passivation layer 14. In still another embodiment, which is more typical to III-V materials, a substantially undoped semiconductor material having a larger bandgap than that of the crystalline semiconductor substrate 10 can be used as the passivation layer and such a material can be grown on the crystalline semiconductor substrate 10 by conventional growth techniques such as, for example, molecular beam epitaxy or metal-organic chemical vapor deposition. The passivation layer 14 that is formed at this stage of the present disclosure is contiguous blanket layer.

Figure 2:
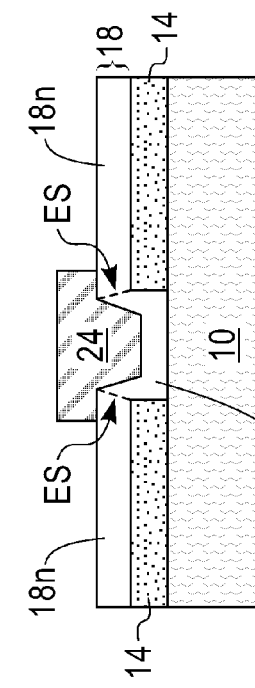
FIG. 2 is a pictorial representation (through a cross sectional view) depicting the structure of FIG. 1 after forming at least one opening within the passivation layer that exposes at least one portion of the surface of the crystalline semiconductor substrate.

Referring now to FIG. 2, there is illustrated the structure of FIG. 1 after forming at least one opening 16 within the passivation layer 14 that exposes at least one portion of the surface of the crystalline semiconductor substrate 10. The at least one opening 16 the can be formed into the passivation layer 14 may be an emitter contact opening, a collector contact opening, a base contact opening, or any combination thereof. In some embodiments, the width of each of the contact openings is in the range of 10 nm to 100 nm. In other embodiments, the width of each of the contact openings is in the range of 50 nm to 1 µm. In yet other embodiments, the width of the contact openings is in the range of 500 nm to 100 µm. Contact openings narrower than 10 nm or wider than 100 µm can also be employed.

The at least one opening 16 that is formed into the passivation layer 14 can be formed by lithography and etching. Lithography includes forming a photoresist material (not shown) on an exposed surface of the passivation layer 14, exposing the photoresist material to a desired pattern of radiation and developing the photoresist material utilizing a conventional resist developer. The etching step, which transfers the pattern from the patterned photoresist into the passivation layer 14, can include dry etching (i.e., reactive ion etching, ion beam etching, or plasma etching), wet chemical etching, or a combination thereof. Typically, a reactive ion etch is used to transfer the pattern from the patterned photoresist into the passivation layer 14. After pattern transfer, the patterned photoresist is typically removed from the structure utilizing a conventional stripping process such as, for example, ashing.

Figure 3:
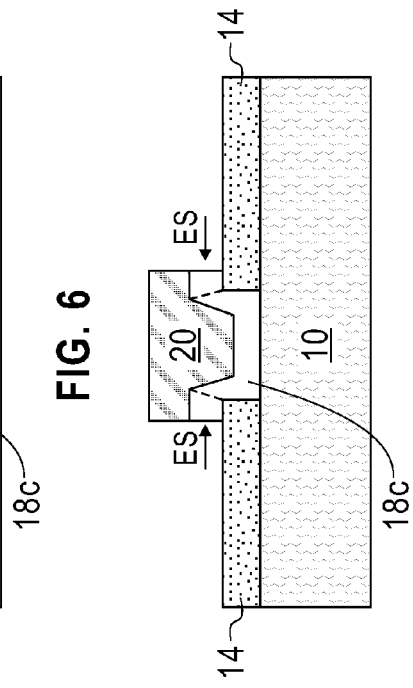
FIG. 3 is a pictorial representation (through a cross sectional view) depicting the structure of FIG. 2 after epitaxially growing a doped $Si_xGe_{1-x}$ layer, wherein x is $0 \leq x \leq 1$, and wherein the doped $Si_xGe_{1-x}$ layer includes a non-crystalline doped $Si_xGe_{1-x}$ portion located on an exposed surface of the passivation layer, and a crystalline doped $Si_xGe_{1-x}$ portion located on the exposed at least one portion of the surface of the crystalline semiconductor substrate.

Referring now to FIG. 3, there is illustrated the structure of FIG. 2 after epitaxially growing a doped $Si_xGe_{1-x}$ layer 18, wherein x is $0 \leq x \leq 1$. The doped $Si_xGe_{1-x}$ layer 18 includes a non-crystalline doped $Si_xGe_{1-x}$ portion 18n located on an exposed surface of the passivation layer 14, and a crystalline doped $Si_xGe_{1-x}$ portion 18c located on the exposed at least one portion of the surface of the crystalline semiconductor substrate 10. In some embodiments, and wherein either an emitter contact or a collector contact is to be formed, the doped $Si_xGe_{1-x}$ layer 18 is of a second conductivity type which is opposite the first conductivity type of the crystalline semiconductor substrate 10. In other embodiments, and wherein a base contact is to be formed, doped $Si_xGe_{1-x}$ layer 18 is of the first conductivity.

In some embodiments, and when x is 1, the doped $Si_xGe_{1-x}$ layer 18 (including the non-crystalline doped $Si_xGe_{1-x}$ portion 18n and the crystalline doped $Si_xGe_{1-x}$ portion 18c) is composed entirely of Si. In other embodiments of the present disclosure, and when x is 0, the doped $Si_xGe_{1-x}$ layer 18 is composed entirely of Ge. In yet another embodiment, and when x is other than 0 or 1, the doped $Si_xGe_{1-x}$ layer 18 is composed of a SiGe alloy.

In accordance with the present disclosure the doped $Si_xGe_{1-x}$ layer 18 (including the non-crystalline doped $Si_xGe_{1-x}$ portion 18n and the crystalline doped $Si_xGe_{1-x}$ portion 18c) contains from 5 atomic % to 40 atomic % hydrogen therein. In one embodiment, the doped $Si_xGe_{1-x}$ layer 18 (including the non-crystalline doped $Si_xGe_{1-x}$ portion 18n and the crystalline doped $Si_xGe_{1-x}$ portion 18c) contains from 10 atomic % to 25 atomic % hydrogen therein. In yet another embodiment, the doped $Si_xGe_{1-x}$ layer 18 (including the non-crystalline doped $Si_xGe_{1-x}$ portion 18n and the crystalline doped $Si_xGe_{1-x}$ portion 18c) contains from 20 atomic % to 30 atomic % hydrogen therein.

In some embodiments of the present disclosure, the doped $Si_xGe_{1-x}$ layer 18 (including the non-crystalline doped $Si_xGe_{1-x}$ portion 18n and the crystalline doped $Si_xGe_{1-x}$ portion 18c) contains C therein. When present, C can be present in a concentration from 0 atomic % to 50 atomic %. In some embodiments, the doped $Si_xGe_{1-x}$ layer 18 (including the non-crystalline doped $Si_xGe_{1-x}$ portion 18n and the crystalline doped $Si_xGe_{1-x}$ portion 18c) contains from 0 atomic % to 25 atomic % carbon therein. The carbon impurity can be added by way of either a source gas that includes carbon, or by introducing a carbon source gas into the gas mixture that is employed in the present disclosure for forming the doped $Si_xGe_{1-x}$ layer 18.

The dopant that is contained within the doped $Si_xGe_{1-x}$ layer 18 can be a p-type dopant or an n-type dopant. In a Si-containing containing doped $Si_xGe_{1-x}$ layer 18, examples of p-type dopants, i.e., impurities, include but are not limited to, boron, aluminum, gallium and indium. In one embodiment, in which $Si_xGe_{1-x}$ layer 18 includes a p-type dopant, the p-type dopant is present in a concentration ranging from $10^{16}$ atoms/cm$^3$ to $10^{21}$ atoms/cm$^3$. In another embodiment, in which the $Si_xGe_{1-x}$ layer 18 contains p-type dopant, the p-type dopant is present in a concentration ranging from $10^{18}$ atoms/cm$^3$ to $5\times10^{20}$ atoms/cm$^3$. In a Si-containing doped $Si_xGe_{1-x}$ layer 18, examples of n-type dopants, i.e., impurities, include but are not limited to, antimony, arsenic and phosphorous. In one embodiment, in which the $Si_xGe_{1-x}$ layer 18 contains an n-type dopant, the n-type dopant is present in a concentration ranging from $10^{16}$ atoms/cm$^3$ to $10^{21}$ atoms/cm$^3$. In another embodiment, in which the $Si_xGe_{1-x}$ layer 18 contains an n-type dopant, the n-type dopant is present in a concentration ranging from $10^{18}$ atoms/cm$^3$ to $5\times10^{20}$ atoms/cm$^3$.

The thickness of the doped $Si_xGe_{1-x}$ layer 18 (including the non-crystalline doped $Si_xGe_{1-x}$ portion 18n and the crystalline doped $Si_xGe_{1-x}$ portion 18c) may range from 2 nm to 100 nm In another embodiment, the thickness of the doped $Si_xGe_{1-x}$ layer 18 (including the non-crystalline doped $Si_xGe_{1-x}$ portion 18n and the crystalline doped $Si_xGe_{1-x}$ portion 18c) ranges from 5 nm to 15 nm.

As indicated above, the doped $Si_xGe_{1-x}$ layer 18 is epitaxially grown. "Epitaxial growth and/or deposition" means the growth of a semiconductor material on a deposition surface of a semiconductor material, in which the semiconductor material being grown has the same (or nearly the same) crystalline characteristics as the semiconductor material of the deposition surface. Therefore, in places in which the doped $Si_xGe_{1-x}$ layer 18 is grown on an exposed surface of the crystalline semiconductor substrate 10, a crystalline doped $Si_xGe_{1-x}$ portion (i.e., material) 18c is formed, while in other places in which the doped $Si_xGe_{1-x}$ layer 18 is grown on the passivation layer 14, a non-crystalline doped $Si_xGe_{1-x}$ portion (i.e., material) 18n is formed. It is noted that the crystalline doped $Si_xGe_{1-x}$ portion 18c may comprise a single crystalline material, a multi-crystalline material or a polycrystalline material, while the non-crystalline doped $Si_xGe_{1-x}$ portion 18n may comprise an amorphous material or a material comprising nano or micro-crystallites.

In accordance with the present disclosure, the doped $Si_xGe_{1-x}$ layer 18 is epitaxially grown at a temperature of less than 500° C. using a gas mixture that includes a source gas, hydrogen and a dopant gas. The lower temperature limit for the epitaxial growth of the doped $Si_xGe_{1-x}$ layer 18 is generally 100° C. In some embodiments, the doped $Si_xGe_{1-x}$ layer 18 can be epitaxially grown at a temperature from 150° C. to 300° C. In other embodiments, doped $Si_xGe_{1-x}$ layer 18 can be epitaxially grown at a temperature from 150° C. to 250° C. The temperatures disclosed herein for the epitaxial growth is at the surface of the substrate in which the epitaxial semiconductor material layer is formed.

In one embodiment of the present disclosure, the doped $Si_xGe_{1-x}$ layer 18 is epitaxially grown utilizing plasma enhanced chemical vapor deposition (PECVD). PECVD is a deposition process used to deposit films from a gas state (vapor) to a solid state on a deposition substrate. Chemical reactions are involved in the process, which occur after creation of a plasma of the reacting gases. A plasma is any gas in which a significant percentage of the atoms or molecules are ionized. Fractional ionization in plasmas used for deposition and related materials processing varies from about $10^{-4}$ in capacitive discharge plasmas to as high as 5-10% in high density inductive plasmas. Processing plasmas are typically operated at pressures of a few millitorr to a few torr, although arc discharges and inductive plasmas can be ignited at atmospheric pressure. In some embodiments, the plasma is created by RF (AC) frequency, such as a radio frequency induced glow charge, or DC discharge between two electrodes, the space between which is filled with the reacting gases. In one example, a PECVD device employs a parallel plate chamber configuration.

As stated above, the doped $Si_xGe_{1-x}$ layer 18 is epitaxially grown from a gas mixture of hydrogen ($H_2$), a dopant gas and a source gas. The source gas may comprise a Si-containing precursor, such as, for example a silane and a disilane and/or a germanium-containing precursor such as, for example, a germane, $GeH_4$. In some embodiments, Si-containing and Ge-containing precursors can be used in forming the doped $Si_xGe_{1-x}$ layer 18. Other gases including a carbon source such, as for example, $CH_4$ may be used.

In one embodiment and to provide epitaxial growth of a doped $Si_xGe_{1-x}$ layer 18, a gas mixture including a ratio of hydrogen to source gas of from greater than 5:1 can be used. In another embodiment, the ratio of hydrogen to source gas that can be used ranges from 5:1 to 1000:1. For example, epitaxial growth of silicon is possible at temperatures as low as 150° C. with ratios of hydrogen to silane ($SiH_4$) ranging from 5:1 to 20:1.

The dopant gas that can be present in the epitaxial growth process provides the conductivity type, either n-type or p-type, to the doped $Si_xGe_{1-x}$ layer 18. In embodiments in which two different conductivity type doped $Si_xGe_{1-x}$ layers are to be used on the same surface of the crystalline semiconductor substrate, block mask technology can be used to protect one of the contact openings during the epitaxial growth of a particular conductivity type doped $Si_xGe_{1-x}$ layer.

When a doped $Si_xGe_{1-x}$ layer 18 of an n-type conductivity is to be formed, the dopant gas includes at least one n-type dopant, e.g., phosphorus or arsenic. For example, when phosphorus is the n-type dopant, the dopant gas can be phosphine ($PH_3$), and when arsenic is the n-type dopant, the dopant gas can be arsine ($AsH_3$). In one example, when the conductivity type dopant is n-type, the dopant gas include phosphine gas ($PH_3$) present in a ratio to silane ($SiH_4$) ranging from 0.01% to 10%. In another example, when the conductivity type dopant is n-type, the dopant gas include phosphine gas ($PH_3$) present in a ratio to silane ($SiH_4$) ranging from 0.1% to 2%.

When a doped $Si_xGe_{1-x}$ layer 18 of a p-type conductivity is to be formed, a dopant gas including at least one p-type dopant, e.g., B, is employed. For example, when boron is the p-type dopant, the dopant gas can be diborane ($B_2H_6$). In one embodiment, wherein the conductivity type dopant is p-type, the dopant gas may be diborane ($B_2H_6$) present in a ratio to silane ($SiH_4$) ranging from 0.01% to 10%. In another embodiment, wherein the conductivity type dopant is p-type, the dopant gas may be diborane ($B_2H_6$) present in a ratio to silane ($SiH_4$) ranging from 0.1% to 2%. In yet another embodiment, in which the conductivity type dopant is p-type, the dopant gas for may be trimethylboron (TMB) present in a ratio to silane ($SiH_4$) ranging from 0.1% to 10%.

The doped $Si_xGe_{1-x}$ layer 18 may have a uniform dopant concentration or may have a graded doped concentration. In one embodiment, to provide a graded dopant concentration in the doped $Si_xGe_{1-x}$ layer 18, the gas flow ratio for the dopant gas may be varied during epitaxial growth of the doped $Si_xGe_{1-x}$ layer 18.

The pressure for the PECVD process that can be used for epitaxially growing the doped $Si_xGe_{1-x}$ layer 18 can range from 10 mTorr to 5 Torr, and in one example may be in the range of 250 mtorr to 900 mTorr. The power density for the PECVD process for epitaxially growing the doped $Si_xGe_{1-x}$ layer 18 may range from 1 $mW/cm^2$ to 100 $mW/cm^2$, and in one example may be in the range of 3 $mW/cm^2$ to 10 $mW/cm^2$. Further details regarding the epitaxial growth process for forming the doped $Si_xGe_{1-x}$ layer 18 of the present disclosure are described in U.S. patent application Ser. No. 13/032,866, filed Feb. 23, 2011, (entitled "LOW-TEMPERATURE SELECTIVE EPITAXIAL GROWTH OF SILICON FOR DEVICE INTEGRATION"), which is owned by the assignee of the present disclosure, and is incorporated herein by reference.

Figure 4:
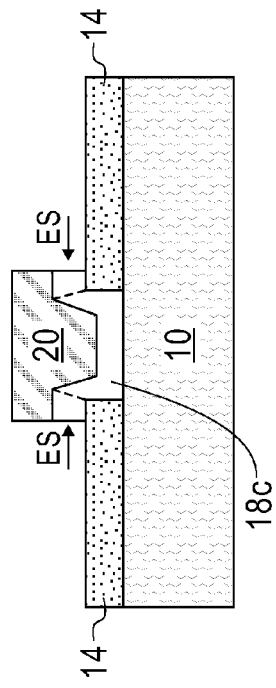
FIG. 4 is a pictorial representation (through a cross sectional view) depicting the structure of FIG. 3 after removing the non-crystalline doped $Si_xGe_{1-x}$ portion selective to the crystalline doped $Si_xGe_{1-x}$ portion.

Referring now to FIG. 4, there is illustrated the structure of FIG. 3 after removing the non-crystalline doped $Si_xGe_{1-x}$ portion 18n selective to the crystalline doped $Si_xGe_{1-x}$ portion 18c. Each remaining crystalline doped $Si_xGe_{1-x}$ portion 18c forms an emitter contact, collector contact and/or base contract of the bipolar junction transistor of the present disclosure. In one embodiment, removing the non-crystalline doped $Si_xGe_{1-x}$ portion 18n selective to the crystalline doped $Si_xGe_{1-x}$ portion 18c includes a hydrogen plasma etch. In some embodiments, the hydrogen plasma etch that can be used to remove the non-crystalline doped $Si_xGe_{1-x}$ portion 18n selective to the crystalline doped $Si_xGe_{1-x}$ portion 18c can be performed in the same reactor chamber as used to form the doped $Si_xGe_{1-x}$ layer 18 without breaking the vacuum of the chamber; such an etch may be referred to herein as an in-situ hydrogen plasma etch. In other embodiments, the hydrogen plasma etch can be performed in a different reactor chamber as that used to form the doped $Si_xGe_{1-x}$ layer 18.

The hydrogen plasma etch that can be used to remove the non-crystalline doped $Si_xGe_{1-x}$ portion 18n selective to the crystalline doped $Si_xGe_{1-x}$ portion 18c can be performed at a temperature of from room temperature to 500° C. and at a hydrogen pressure from 10 mtorr to 5 torr. In some embodiments, the hydrogen plasma etch is performed at a temperature of from 100° C. to 250° C. and at a hydrogen pressure from 10 mtorr to 1 torr. The hydrogen plasma etch can be performed utilizing one of hydrogen or HCl as a source of the hydrogen plasma. In some embodiments, the etch selectivity for removing the non-crystalline doped $Si_xGe_{1-x}$ portion 18n relative to the crystalline doped $Si_xGe_{1-x}$ portion 18c is from 2:1 to 10:1.

In some embodiments, the removal of the non-crystalline doped $Si_xGe_{1-x}$ portion 18n selective to the crystalline doped $Si_xGe_{1-x}$ portion 18c can be performed using other types of plasmas besides hydrogen plasma including, for example, $Cl_2$ or Ar.

Figure 5:
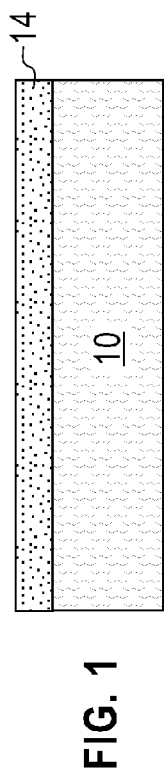
FIG. 5 is a pictorial representation (through a cross sectional view) depicting the structure of FIG. 4 after forming an electrode on an exposed surface of the crystalline doped $Si_xGe_{1-x}$ portion.

Referring now to FIG. 5, there is depicted the structure of FIG. 4 after forming an electrode 20 on each exposed surface of the crystalline doped $Si_xGe_{1-x}$ portion 18c. The electrode 20 can be comprised of a conductive material including, for example, a doped Si-containing material, a conductive metal, a conductive metal alloy comprising at least two conductive metals, a conductive metal nitride, a transparent conductive oxide and/or a conductive metal silicide. Examples of conductive metals that can be used include, for example, Cu, W, Pt, Al, Pd, Ru, Ni, and Ir.

The conductive material used in forming the electrode 20 can be formed using a deposition process including, for example, chemical vapor deposition, plasma enhanced chemical vapor deposition, sputtering, chemical solution deposition, or plating. Metal silicides can be formed utilizing any conventional silicidation process that is well known to those skilled in the art. In some embodiments, the conductive material can be patterned by lithography and etching as described hereinabove.

In cases in which a semiconductor contact is needed on the other side of the crystalline semiconductor substrate 10, the crystalline semiconductor substrate 10 can be flipped 180° and the exposed bare surface of the crystalline semiconductor substrate 10 can be processed to include an epitaxial semiconductor material contact and an electrode can be formed on an exposed surface of the epitaxial semiconductor contact. The epitaxial semiconductor contact can span the entirely length of the bare surface of the crystalline semiconductor substrate 10 and the above epitaxial growth process or any other epitaxial growth process can be used to form the epitaxial semiconductor contact. Alternatively, another passivation layer can be formed on the bare surface of the crystalline semiconductor substrate, and then patterned to include at least one opening therein. Thereafter, the above or another epitaxial growth process can be used to form the epitaxial semiconductor contact on the other side of the crystalline semiconductor substrate.

The selective method described above and as illustrated in FIGS. 1-5 provides a bipolar junction transistor in which a portion of electrode 20 directly contacts an exposed surface of the passivation layer 14.

In addition to the selective method described above, the present disclosure also provides a non-selective method of forming a bipolar junction transistor. The non-selective method of the present disclosure is similar to the selective method however a mask, typically the electrode, is formed atop the crystalline doped $Si_xGe_{1-x}$ portion and on an exposed surface of an adjoining end segment of the non-crystalline doped $Si_xGe_{1-x}$ portion. The remaining non-crystalline doped $Si_xGe_{1-x}$ portion not protected by the mask is then removed.

The non-selective method of the present disclosure begins by first providing the structure shown in FIG. 3 of the selective method of the present disclosure. Next, a mask 24 can be formed on the exposed surface of the crystalline doped $Si_xGe_{1-x}$ portion 18c and an adjoining end segment, ES, of the non-crystalline doped $Si_xGe_{1-x}$ portion 18n. The resultant structure is shown, for example, in FIG. 6.

In one embodiment, the mask 24 that can be used in the non-selective method of the present disclosure may include a hard mask material that is the same or different from that of the passivation layer 14. In another embodiment, mask 24 may be composed of one of the conductive materials mentioned above for electrode 20. The usage of a conductive material as mask 24 is advantage since the same material can be used as the electrode of the bipolar junction transistor.

Figure 6:
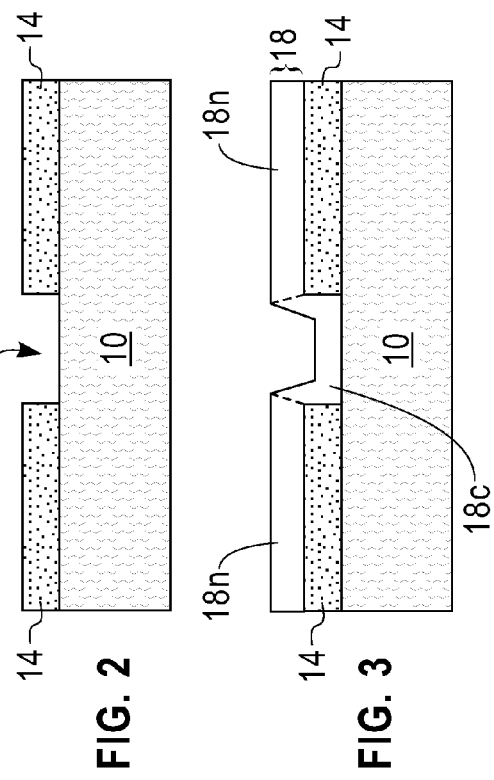
FIG. 6 is a pictorial representation (through a cross sectional view) depicting the structure of FIG. 3 after forming a mask atop the crystalline doped $Si_xGe_{1-x}$ portion and an adjoining end segment of the non-crystalline doped $Si_xGe_{1-x}$ portion in accordance with another embodiment of the present disclosure.

The mask 24 can be formed by providing a blanket layer of mask material (i.e., hard mask material or conductive material) utilizing one of the techniques mentioned above for either forming the passivation layer 14, or forming the conductive material that forms the electrode 20. After forming the blanket layer of mask material, the blanket layer of mask material is patterned by lithography and etching to provide the structure shown in FIG. 6. The etch is selective in removing exposed portions of the mask material. As shown in FIG. 6, the adjoining end segment, ES, of the non-crystalline doped $Si_xGe_{1-x}$ portion 18n which are in contact with the crystalline doped $Si_xGe_{1-x}$ portion 18c of doped $Si_xGe_{1-x}$ layer 18 are protected by the mask 24, while remaining portions of the non-crystalline doped $Si_xGe_{1-x}$ portion 18n are left exposed.

Figure 7:
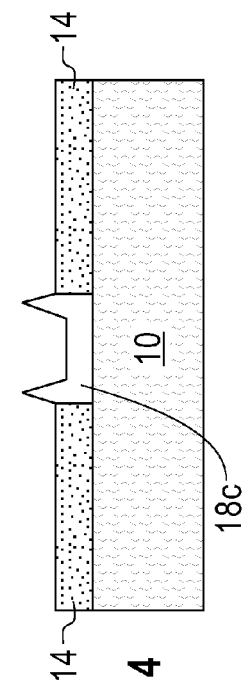
FIG. 7 is a pictorial representation (through a cross sectional view) depicting the structure of FIG. 6 after removing a remaining non-crystalline doped $Si_xGe_{1-x}$ portion that is not protected by the mask.

Referring now to FIG. 7, there is illustrated the structure of FIG. 6 after removing the remaining non-crystalline doped $Si_xGe_{1-x}$ portion that is not protected by the mask 24 utilizing an etching step. The etch that can be used in this embodiment of the present disclosure may include for example, a dry etch process such as, for example, reactive ion etching, plasma etching or ion beam etching. Alternatively, a chemical wet etch can be employed. In one embodiment, the remaining portion of the crystalline doped $Si_xGe_{1-x}$ portion 18n that is not protected by mask 24 can be removed by $SF_6$, $SF_6/O_2$ or $CCl_2F_2/O_2$ plasma.

If the mask 24 is other then a conductive material, the mask 24 can be removed by conventional techniques, such as planarization and/or grinding, and an electrode 20 can be formed as described above. In embodiments in which mask 24 is a conductive material, the mask 24 serves as one of the electrodes of the bipolar junction transistor of this embodiment of the present disclosure. In FIG. 7, mask 24 is a conductive material and thus it serves as electrode 20.

In the non-selective method described above, the adjoining end segment, Es, of the non-crystalline doped $Si_xGe_{1-x}$ portion 18n which is located beneath the electrode 20 is present in the bipolar junction transistor. In this embodiment of the present disclosure, no portion of electrode 20 of the bipolar junction transistor produced by the non-selective method directly contacts an exposed surface of passivation layer 14. Instead, an adjoining end segment, ES, of the non-crystalline doped $Si_xGe_{1-x}$ portion 18n is positioned between the electrode 20 and an exposed surface of the passivation layer 14. Thus, a bipolar junction transistor is provided in which the electrode 20 has an outer edge that is vertically coincident with an outer edge of the adjoining end segment, Es, of the non-crystalline doped $Si_xGe_{1-x}$ portion 18n and wherein an inner edge of the adjoining end segment, ES, of the non-crystalline doped $Si_xGe_{1-x}$ portion 18n is in direct contact with a portion of the crystalline doped $Si_xGe_{1-x}$ portion 18c.

It is noted that the although FIGS. 6-7 illustrate the formation of an epitaxially grown contact and electrode on one side of the crystalline semiconductor substrate 10, the other side of the crystalline semiconductor substrate 10 can be processed to include other epitaxially grown contacts and electrodes. In some embodiments, the other side of the crystalline semiconductor substrate 10 can be processed to include an epitaxially grown contact that spans the entire length of the crystalline semiconductor substrate and thereafter an electrode can be formed on the exposed surface of the epitaxially grown contact. In other embodiments, the selective or non-selective method including the use of a patterned passivation layer 14 can be used to process the other side of the crystalline semiconductor substrate 10.

Figure 8:
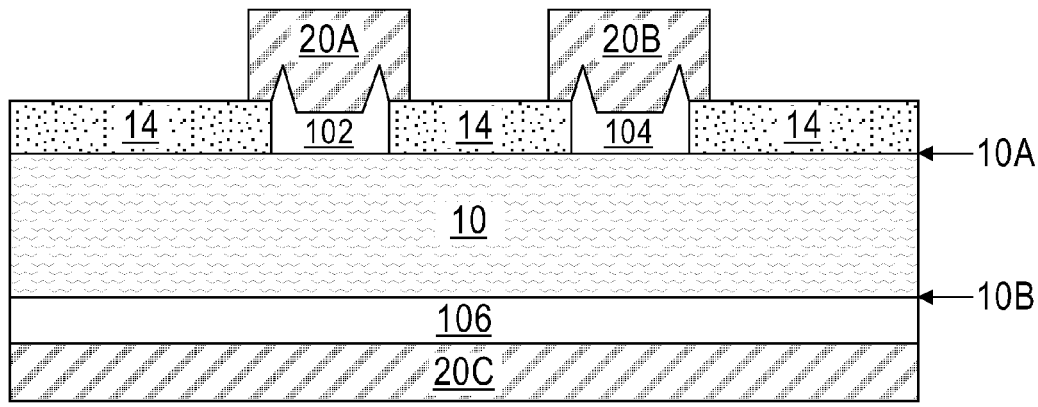
FIG. 8 is a pictorial representation (through a cross sectional view) depicting a first exemplary bipolar junction transistor that can be formed utilizing the basic processing steps depicted in FIGS. 1-5.

Reference is now made to FIG. 8 which depicts a first exemplary bipolar junction transistor 100 that can be formed utilizing the basic processing steps depicted in FIGS. 1-5. In this exemplary embodiment, the selective method described in FIGS. 1-5 is used to form the emitter contact and base contact on one side of the crystalline semiconductor substrate 10, while the base contact and the corresponding electrode are formed as blanket layers on the other side of the crystalline substrate 10. The base contact is epitaxially grown utilizing the PECVD method described herein above. The order of processing the different sides of the crystalline semiconductor substrate 10 may vary.

Specifically, FIG. 8 illustrates a bipolar junction transistor 100 that includes a crystalline semiconductor substrate 10 of a first conductivity type (n-or p-type) and having a first surface 10A and a second surface 10B that is opposite to the first surface 10A. A passivation layer 14 having an emitter contact opening (not specifically labeled) and a collector contact opening (not specifically labeled) are located on the first surface 10A. An emitter contact 102 is located within the emitter contact opening. The emitter contact 102 includes a first crystalline doped $Si_xGe_{1-x}$ material of a second conductivity type which contains from 5 atomic % to 40 atomic % hydrogen, wherein x is $0 \leq x \leq 1$. In accordance with the present disclosure, the second conductivity type of the emitter contact 102 is different from the first conductivity type of the crystalline semiconductor substrate 10. In one embodiment, the first conductivity of the crystalline semiconductor substrate 10 is n-type, and the second conductivity type of the emitter contact 102 is p-type. In another embodiment, the first conductivity of the crystalline semiconductor substrate 10 is p-type, and the second conductivity type of the emitter contact 102 is n-type.

The bipolar junction transistor of FIG. 8 also includes a collector contact 104 located within the collector contact opening. The collector contact 104 includes a second crystalline doped $Si_xGe_{1-x}$ material of the second conductivity type and containing from 5 atomic % to 40 atomic % hydrogen, wherein x is $0 \leq x \leq 1$. In one embodiment of the present disclosure, the second crystalline doped $Si_xGe_{1-x}$ material of the collector contact 104 may be a same material as that of the first crystalline doped $Si_xGe_{1-x}$ material of the emitter contact 102. In such an embodiment, the doping concentration of second crystalline doped $Si_xGe_{1-x}$ material of the collector contact 104 may be the same or different than that of the first crystalline doped $Si_xGe_{1-x}$ material of the emitter contact 102. In another embodiment of the present disclosure, the second crystalline doped $Si_xGe_{1-x}$ material of the collector contact 104 may be a different material as that of the first crystalline doped $Si_xGe_{1-x}$ material. Different dopant concentration and different materials within the emitter contact 102 and the collector contact 104 can be achieved utilizing block mask technology.

The bipolar junction transistor of FIG. 8 also includes a base contact 106 of the first conductivity type located on the second surface 10B of the crystalline semiconductor substrate 10. The base contact 106 may comprise a third crystalline doped $Si_xGe_{1-x}$ material that is formed utilizing the epitaxially growth method described above. As shown, the base contact 106 spans the entire length of the second surface 10B. The bipolar junction transistor structure further includes a first electrode 20A located on an exposed surface of the emitter contact 102, a second electrode 20B located on an exposed surface of the collector contact 104, and a third electrode 20C located on an exposed surface of the base contact 106. The first, second and third electrodes 20A, 20B, and 20C may include one of the conductive materials as described above for electrode 20. In some embodiments, the first, second and third electrodes 20A, 20B, and 20C may comprise a same conductive material. In other embodiments, at least one of the first, second and third electrodes 20A, 20B, and 20C may comprise a different conductive material from the other electrodes.

Figure 9:
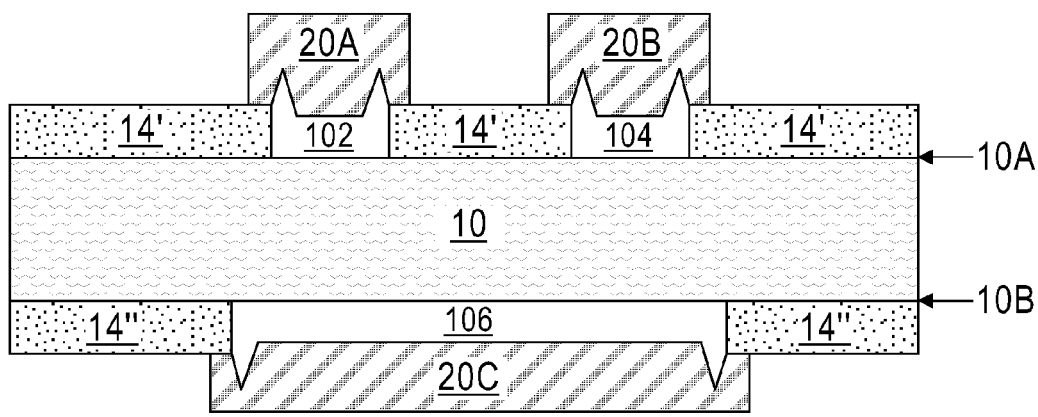
FIG. 9 is a pictorial representation (through a cross sectional view) depicting a second exemplary bipolar junction transistor that can be formed utilizing the basic processing steps depicted in FIGS. 1-5.

Referring now to FIG. 9, there is depicted a second exemplary bipolar junction transistor 200 that can be formed utilizing the basic processing steps depicted in FIGS. 1-5. In this embodiment, the selective method is used to process both sides 10A, 10B of the crystalline semiconductor substrate 10. Thus, a passivation layer is present on both sides of the crystalline semiconductor substrate 10. The passivation layers located on the different sides of the crystalline semiconductor substrate 10 can be composed of the same or different material. The order of processing the different sides of the crystalline semiconductor substrate 10 may vary.

Specifically, FIG. 9 illustrates a bipolar junction transistor 200 that includes a crystalline semiconductor substrate 10 of a first conductivity type (n-or p-type) and having a first surface 10A and a second surface 10B that is opposite to the first surface 10A. A passivation layer 14' having an emitter contact opening (not specifically labeled) and a collector contact opening (not specifically labeled) are located on the first surface 10A. An emitter contact 102 is located within the emitter contact opening. The emitter contact 102 includes a first crystalline doped $Si_xGe_{1-x}$ material of a second conductivity type which contains from 5 atomic % to 40 atomic % hydrogen, wherein x is $0 \leq x \leq 1$. In accordance with the present disclosure, the second conductivity type of the emitter contact 102 is different from the first conductivity type of the crystalline semiconductor substrate 10. In one embodiment, the first conductivity of the crystalline semiconductor substrate 10 is n-type, and the second conductivity type of the emitter contact 102 is p-type. In another embodiment, the first conductivity of the crystalline semiconductor substrate 10 is p-type, and the second conductivity type of the emitter contact 102 is n-type.

The bipolar junction transistor of FIG. 9 also includes a collector contact 104 located within the collector contact opening. The collector contact 104 includes a second crystalline doped $Si_xGe_{1-x}$ material of the second conductivity type and containing from 5 atomic % to 40 atomic % hydrogen, wherein x is $0 \leq x \leq 1$. In one embodiment of the present disclosure, the second crystalline doped $Si_xGe_{1-x}$ material of the collector contact 104 may be a same material as that of the first crystalline doped $Si_xGe_{1-x}$ material of the emitter contact 102. In such an embodiment, the doping concentration of second crystalline doped $Si_xGe_{1-x}$ material of the collector contact 104 may be the same or different than that of the first crystalline doped $Si_xGe_{1-x}$ material of the emitter contact 102. In another embodiment of the present disclosure, the second crystalline doped $Si_xGe_{1-x}$ material of the collector contact 104 may be a different material as that of the first crystalline doped $Si_xGe_{1-x}$ material of the emitter contact. Different dopant concentration and different materials within the emitter contact 102 and the collector contact 104 can be achieved utilizing block mask technology.

The bipolar junction transistor of FIG. 9 also includes another passivation layer 14" located on the second surface 10B of the crystalline semiconductor substrate 10. The another passivation layer 14" includes a base contact opening (not specifically labeled) that is filled with a base contact 106 of the first conductivity type located on the second surface 10B of the crystalline semiconductor substrate 10. The base contact 106 comprises a third crystalline doped $Si_xGe_{1-x}$ material that is formed utilizing the epitaxially growth method described above. The bipolar junction transistor structure further includes a first electrode 20A located on an exposed surface of the emitter contact 102, a second electrode 20B located on an exposed surface of the collector contact 104', and a third electrode 20C located on an exposed surface of the base contact 106. The first, second and third electrodes 20A, 20B, and 20C may include one of the conductive materials as described above for electrode 20. In some embodiments, the first, second and third electrodes 20A, 20B, and 20C may comprise a same conductive material. In other embodiments, at least one of the first, second and third electrodes 20A, 20B, and 20C may comprise a different conductive material from the other electrodes.

Figure 10:
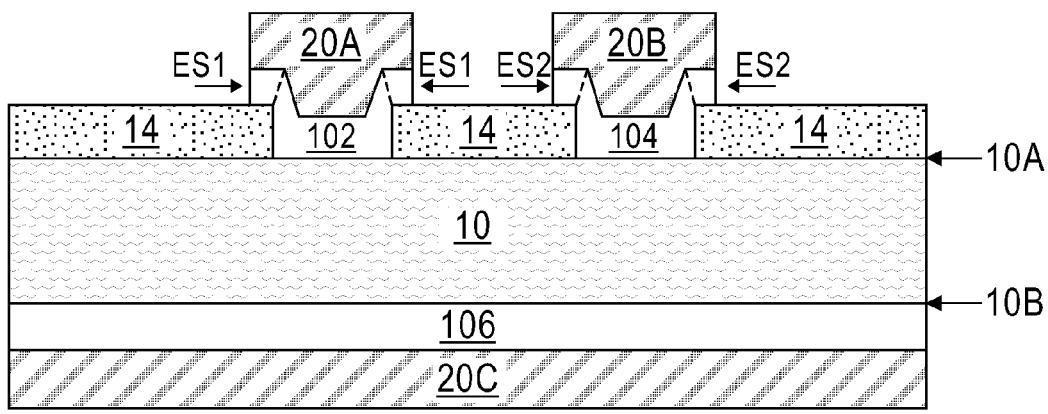
FIG. 10 is a pictorial representation (through a cross sectional view) depicting a third exemplary bipolar junction transistor that can be formed utilizing the basic processing steps depicted in FIGS. 1-3 and 6-7.

Referring now to FIG. 10, there is depicted a third exemplary bipolar junction transistor 300 that can be formed utilizing the basic processing steps depicted in FIGS. 1-3 and 6-7. The order of processing the different sides of the crystalline semiconductor substrate 10 may vary.

The third exemplary bipolar junction transistor includes the same components as mentioned above for the first exemplary bipolar junction transistor 100 shown in FIG. 8 except that an adjoining end segment of a non-crystalline doped $Si_xGe_{1-x}$ material is present beneath each electrode within the emitter contact region and the collector contact region. In FIG. 10, the emitter contact region includes an adjoining end segment of a first non-crystalline doped $Si_xGe_{1-x}$ material ES1 positioned between the first electrode 20A, and an exposed surface of passivation layer 14, while the collector contact region includes an adjoining end segment of a second non-crystalline doped $Si_xGe_{1-x}$ material ES2 positioned between the second electrode 20B, and an exposed surface of passivation layer 14.

Figure 11:
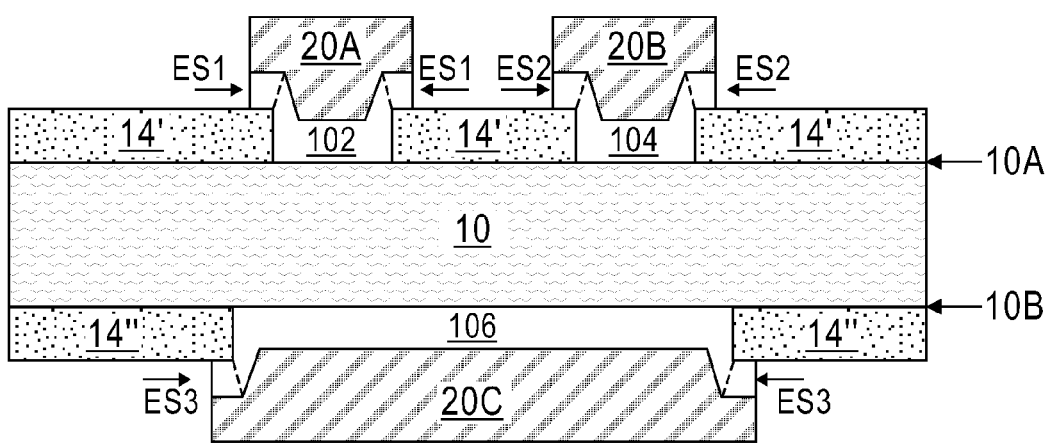
FIG. 11 is a pictorial representation (through a cross sectional view) depicting a fourth exemplary bipolar junction transistor that can be formed utilizing the basic processing steps depicted in FIGS. 1-3 and 6-7.

Referring to FIG. 11, there is depicted, a fourth exemplary bipolar junction transistor 400 that can be formed utilizing the basic processing steps depicted in FIGS. 1-3 and 6-7. The order of processing the different sides of the crystalline semiconductor substrate 10 may vary.

The fourth exemplary bipolar junction transistor includes the same components as mentioned above for the second exemplary bipolar junction transistor 200 shown in FIG. 9 except that an adjoining end segment of a non-crystalline doped $Si_xGe_{1-x}$ material is present beneath each electrode within the emitter contact region, the collector contact region and base contact region. In FIG. 11, the emitter contact region includes an adjoining end segment of a first non-crystalline doped $Si_xGe_{1-x}$ material ES1 positioned between the first electrode 20A, and an exposed surface of passivation layer 14', while the collector contact region includes an adjoining end segment of a second non-crystalline doped $Si_xGe_{1-x}$ material ES2 positioned between the second electrode 20B, and an exposed surface of passivation layer 14'. The base contact region includes an adjoining end segment of a third non-crystalline doped $Si_xGe_{1-x}$ material ES3 positioned between the third electrode 20C, and an exposed surface of passivation layer 14".

Figure 12:
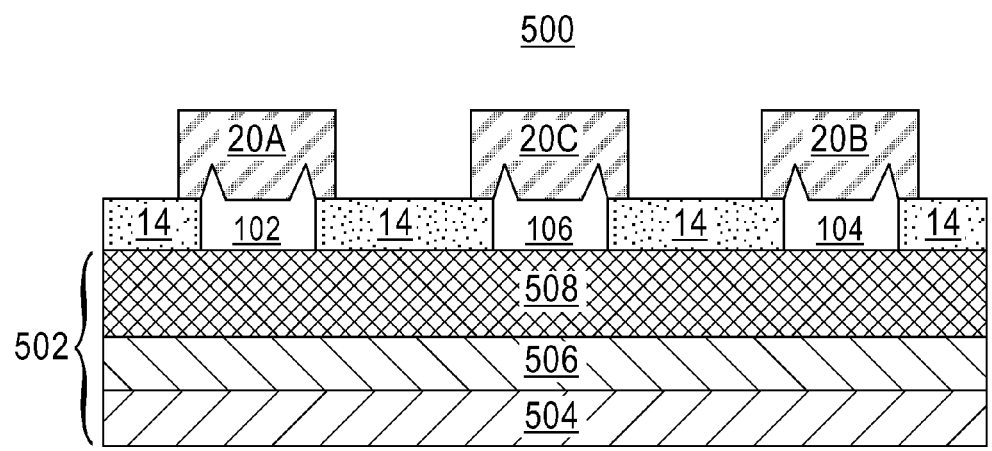
FIG. 12 is a pictorial representation (through a cross sectional view) depicting a fifth exemplary bipolar junction transistor that can be formed utilizing the basic processing steps depicted in FIGS. 1-5.

Referring now to FIG. 12, there is depicted a fifth exemplary bipolar junction transistor 500 that can be formed utilizing the basic processing steps depicted in FIGS. 1-5. The fifth exemplary bipolar junction transistor 500 shown in FIG. 12 includes a semiconductor-on-insulator substrate 502 that includes a handle substrate 504, a buried insulating layer 506, and a crystalline top semiconductor layer 508. The crystalline top semiconductor layer 508 can be composed of an III-V compound semiconductor or a semiconductor material having the formula $Si_yGe_{1-y}$ wherein y is $0 \leq y \leq 1$. The crystalline top semiconductor layer 508 is of a first conductivity type (i.e., either n-type or p-type).

The fifth bipolar junction transistor 500 shown in FIG. 12 includes a passivation layer 14 having an emitter contact opening (not labeled), a collector contact opening (not labeled) and a base contact opening (not labeled) located on a surface of the crystalline top semiconductor layer 506. An emitter contact 102 is located within the emitter contact opening, The emitter contact 102 includes a first crystalline doped $Si_xGe_{1-x}$ material of a second conductivity type which is opposite the first conductivity type and contains from 5 atomic % to 40 atomic % hydrogen, wherein x is $0 \leq x \leq 1$. A collector contact 104 is located within the collector contact opening. The collector contact 104 includes a second crystalline doped $Si_xGe_{1-x}$ material of the second conductivity type which contains from 5 atomic % to 40 atomic % hydrogen, wherein x is $0 \leq x \leq 1$. A base contact 106 is located within the base contact opening. The base contact 106 includes a third crystalline doped $Si_xGe_{1-x}$ material of the first conductivity type which contains from 5 atomic % to 40 atomic % hydrogen, wherein x is $0 \leq x \leq 1$. The crystalline materials making up the various contact regions may comprise a same material (with or without the same dopant concentration), or at least one of them includes a different material. Block mask technology can be used in instances in which different materials and/or dopant concentrations are present in the various contact regions. The bipolar junction transistor 500 also includes a first electrode 20A located on an exposed surface of the emitter contact 102, a second electrode 20B located on an exposed surface of the collector contact 104, and a third electrode 20C located on an exposed surface of the base contact 106.

Figure 13:
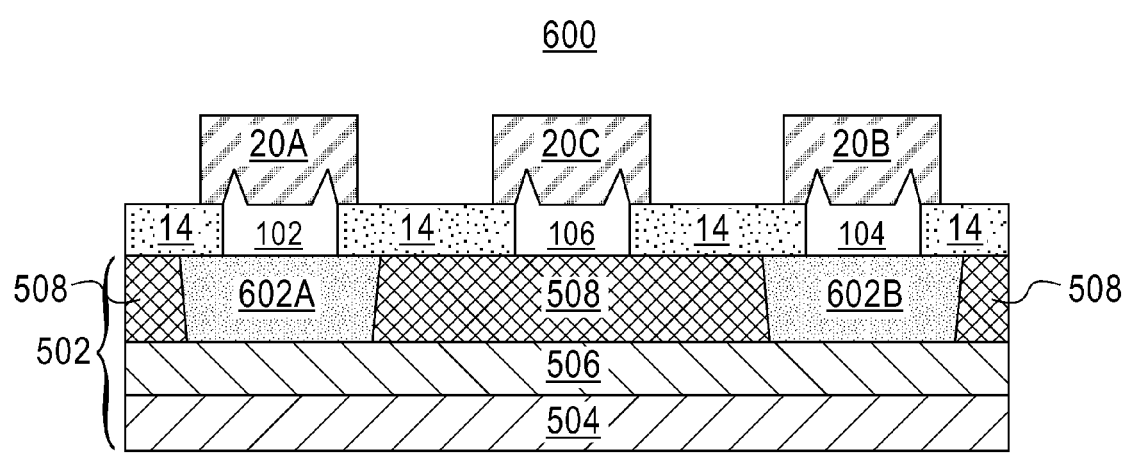
FIG. 13 is a pictorial representation (through a cross sectional view) depicting a sixth exemplary bipolar junction transistor that can be formed utilizing the basic processing steps depicted in FIGS. 1-5.

Referring now to FIG. 13, there is depicted a sixth exemplary bipolar junction transistor 600 that can be formed utilizing the basic processing steps depicted in FIGS. 1-5. The sixth exemplary bipolar junction transistor 600 is similar to that of the fifth exemplary bipolar junction transistor 500 except that a doped region 602A, 602B of the second conductivity type is formed into the crystalline top semiconductor layer 508 in the regions in which the emitter contact 102 and the collector contact 104 are to be formed. The doped region 602A, 602B can be formed by ion implantation or gas phase doping using passivation layer 14 having the emitter contact opening and collector contact opening formed therein as a mask. The doped regions 602A, 602B can be formed at the same time, or alternatively they can be formed at different times. The doped regions 602A, 602B can have the same dopant concentration or they can have different dopant concentrations. Typically, the dopant concentration within doped regions 602A, 602B is lower than the dopant concentration of the first and second crystalline doped $Si_xGe_{1-x}$ materials. One surface of the dopant region 602A, 602B is in contact with a surface of a corresponding emitter contact 102, or collector contact 104. Another surface of the dopant region 602A, 602B can be in contact with a surface of the buried insulating layer 504. A p-n junction forms between the dopant region 602A, 602B and the remaining portion of the crystalline top semiconductor layer 508 which is of a first conductivity type. Thus, and in some embodiments, the dopant region 602A, 602B can be of a p-type conductivity, while the remaining portion of the crystalline top semiconductor layer 508 is of an n-type conductivity. In other embodiments, the dopant region 602A, 602B can be of an n-type conductivity, while the remaining portion of the crystalline top semiconductor layer 508 is of a p-type conductivity.

Figure 14:
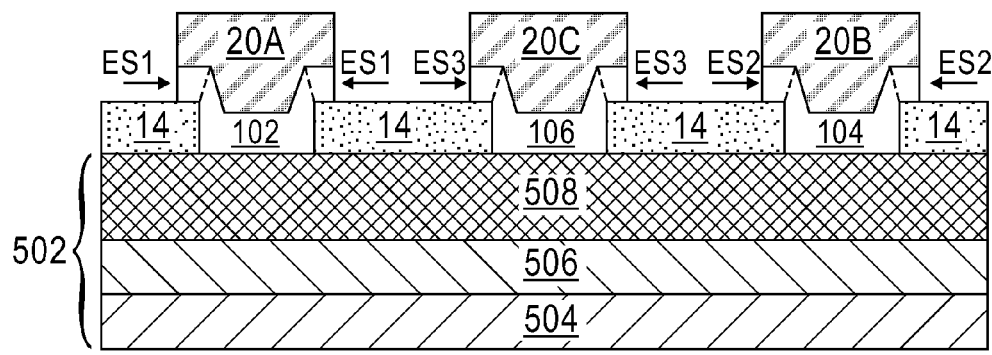
FIG. 14 is a pictorial representation (through a cross sectional view) depicting a seventh exemplary bipolar junction transistor that can be formed utilizing the basic processing steps depicted in FIGS. 1-3 and 6-7.

Referring now to FIG. 14, there is depicted a seventh exemplary bipolar junction transistor 700 that can be formed utilizing the basic processing steps depicted in FIGS. 1-3 and 6-7. The seventh exemplary bipolar junction transistor 700 is similar to the fifth exemplary bipolar junction transistor 500 except for the presence of an adjoining end segment of a non-crystalline doped $Si_xGe_{1-x}$ material is present beneath each electrode within the emitter contact region, the collector contact region and base contact region. In FIG. 14, the emitter contact region includes an adjoining end segment of a first non-crystalline doped $Si_xGe_{1-x}$ material ES1 positioned between the first electrode 20A, and an exposed surface of passivation layer 14, while the collector contact region includes an adjoining end segment of a second non-crystalline doped $Si_xGe_{1-x}$ material ES2 positioned between the second electrode 20B, and an exposed surface of passivation layer 14. The base contact region includes an adjoining end segment of a third non-crystalline doped $Si_xGe_{1-x}$ material ES3 positioned between the third electrode 20C, and an exposed surface of passivation layer 14.

Figure 15:
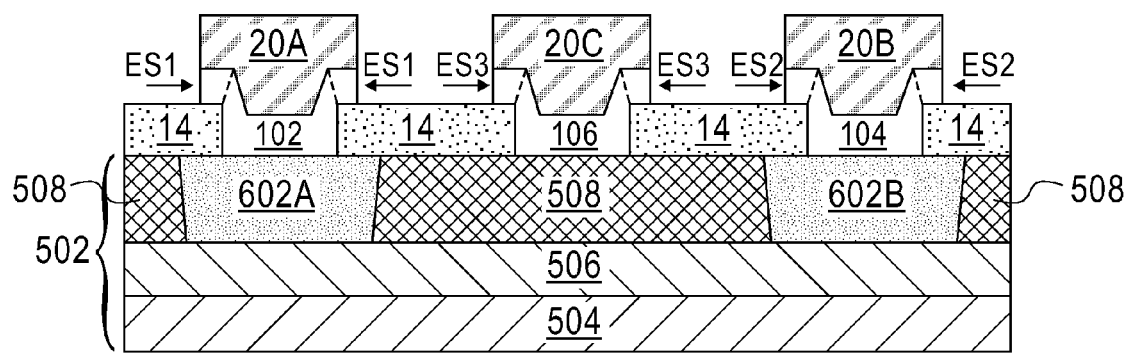
FIG. 15 is a pictorial representation (through a cross sectional view) depicting an eighth exemplary bipolar junction transistor that can be formed utilizing the basic processing steps depicted in FIGS. 1-3 and 6-7.

Referring now to FIG. 15, there is depicted an eighth exemplary bipolar junction transistor 800 that can be formed utilizing the basic processing steps depicted in FIGS. 1-3 and 6-7. The eighth exemplary bipolar junction transistor 800 is similar to the sixth exemplary bipolar junction transistor 600 except for the presence of an adjoining end segment of a non-crystalline doped $Si_xGe_{1-x}$ material is present beneath each electrode within the emitter contact region, the collector contact region and base contact region. In FIG. 15, the emitter contact region includes an adjoining end segment of a first non-crystalline doped $Si_xGe_{1-x}$ material ES1 positioned between the first electrode 20A, and an exposed surface of passivation layer 14, while the collector contact region includes an adjoining end segment of a second non-crystalline doped $Si_xGe_{1-x}$ material ES2 positioned between the second electrode 20B, and an exposed surface of passivation layer 14. The base contact region includes an adjoining end segment of a third non-crystalline doped $Si_xGe_{1-x}$ material ES3 positioned between the third electrode 20C, and an exposed surface of passivation layer 14.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed as new is:

1. A bipolar junction transistor comprising:
 a crystalline semiconductor substrate of a first conductivity type;

an emitter contact of a second conductivity type opposite to the first conductivity type located on a first surface portion of said crystalline semiconductor substrate;

a collector contact of the second conductivity type located on a second surface portion of said crystalline semiconductor substrate;

a base contact of the first conductivity type located on a third surface portion of said crystalline semiconductor substrate;

a first electrode located on an exposed surface of the emitter contact;

a second electrode located on an exposed surface of the collector contact; and a third electrode located on an exposed surface of the base contact, wherein at least one of said emitter contact, said collector contact and said base contact comprises a crystalline doped $Si_xGe_{1-x}$ material containing from 5 atomic % to 40 atomic % hydrogen, wherein x is $0 \leq x \leq 1$.

2. The bipolar junction transistor of claim 1, wherein said crystalline doped $Si_xGe_{1-x}$ material further comprises at least one of carbon, germanium, phosphorus, arsenic or boron.

3. The bipolar junction transistor of claim 1, wherein said crystalline doped $Si_xGe_{1-x}$ material has a dopant concentration ranging from $10^{16}$ atoms/cm$^3$ to $5 \times 10^{20}$ atoms/cm$^3$.

4. The bipolar junction transistor of claim 1, wherein said crystalline semiconductor substrate is a bulk semiconductor comprising an III-V compound semiconductor or a semiconductor material having the formula $Si_yGe_{1-y}$ wherein y is $0 \leq y \leq 1$.

5. The bipolar junction transistor of claim 1, wherein said crystalline semiconductor substrate comprises a semiconductor-on-insulating substrate including a handle substrate, a buried insulating layer, a top crystalline semiconductor layer, said top crystalline semiconductor layer comprises a III-V compound semiconductor or a semiconductor material having the formula $Si_yGe_{1-y}$ wherein y is $0 \leq y \leq 1$, and wherein each of the emitter contact, collector contact and base contact are present on a surface of said top crystalline semiconductor layer.

6. The bipolar junction transistor of claim 5, wherein a doped region of the second conductivity type is present in said top semiconductor layer and located directly beneath each of said emitter and collector contacts.

7. A bipolar junction transistor comprising:

a crystalline semiconductor substrate of a first conductivity type and having a first surface and a second surface that is opposite to said first surface;

a passivation layer having an emitter contact opening and a collector contact opening located on said first surface;

an emitter contact located within said emitter contact opening and comprising a first crystalline doped $Si_xGe_{1-x}$ material of a second conductivity type and containing from 5 atomic % to 40 atomic % hydrogen, wherein x is $0 \leq x \leq 1$ and said second conductivity type is different from said first conductivity type;

a collector contact located within said collector contact opening and comprising a second crystalline doped $Si_xGe_{1-x}$ material of said second conductivity type and containing from 5 atomic % to 40 atomic % hydrogen, wherein x is $0 \leq x \leq 1$;

a base contact of said first conductivity type located on said second surface of said crystalline semiconductor substrate;

a first electrode located on an exposed surface of the emitter contact;

a second electrode located on an exposed surface of the collector contact; and a third electrode located on an exposed surface of the base contact.

8. The bipolar junction transistor of claim 7, wherein said base contact comprises a third crystalline doped $Si_xGe_{1-x}$ material of said first conductivity type and containing from 5 atomic % to 40 atomic % hydrogen, wherein x is $0 \leq x \leq 1$.

9. The bipolar junction transistor of claim 7, wherein said base contact extends entirely across said second surface of said crystalline semiconductor substrate.

10. The bipolar junction transistor of claim 8, further comprising another passivation layer having a base contact opening located on said second surface of said crystalline semiconductor substrate.

11. The bipolar junction transistor of claim 7, wherein a portion of each of said first and second electrodes directly contacts an exposed surface of said passivation layer.

12. The bipolar junction transistor of claim 10, wherein a portion of said third electrode directly contacts an exposed surface of said another passivation layer.

13. The bipolar junction transistor of claim 7, wherein no portion of each of said first and second electrodes directly contacts an exposed surface of said passivation layer, and wherein a non-crystalline doped $Si_xGe_{1-x}$ material of said second conductivity type is positioned between said first and second electrodes and said exposed surface of said passivation layer.

14. The bipolar junction transistor of claim 13, wherein each of said first and second electrodes has an outer edge that is vertically coincident with an outer edge of said non-crystalline doped $Si_xGe_{1-x}$ material and wherein an inner edge of said non-crystalline doped $Si_xGe_{1-x}$ material is in direct contact with a portion of said crystalline doped $Si_xGe_{1-x}$ material.

15. The bipolar junction transistor of claim 10, wherein no portion of said third electrode directly contacts an exposed surface of said another passivation layer, and wherein a non-crystalline doped $Si_xGe_{1-x}$ material of said first conductivity type is positioned between said third electrode and said exposed surface of said another passivation layer.

16. The bipolar junction transistor of claim 15, wherein said third electrode has an outer edge that is vertically coincident with an outer edge of said non-crystalline doped $Si_xGe_{1-x}$ material and wherein an inner edge of said non-crystalline doped $Si_xGe_{1-x}$ material is in direct contact with a portion of said crystalline doped $Si_xGe_{1-x}$ material.

17. A bipolar junction transistor comprising:

a semiconductor substrate comprising a handle substrate, a buried insulating layer, and a crystalline top semiconductor layer, wherein said crystalline top semiconductor layer is of a first conductivity type and comprises a III-V compound semiconductor or a semiconductor material having the formula $Si_yGe_{1-y}$ wherein y is $0 \leq y \leq 1$;

a passivation layer having an emitter contact opening, a collector contact opening and a base contact opening located on a surface of said crystalline top semiconductor layer;

an emitter contact located within said emitter contact opening and comprising a first crystalline doped $Si_xGe_{1-x}$ material of a second conductivity type and containing from 5 atomic % to 40 atomic % hydrogen, wherein x is $0 \leq x \leq 1$ and said second conductivity type is different from said first conductivity type;

a collector contact located within said collector contact opening and comprising a second crystalline doped $Si_xGe_{1-x}$ material of said second conductivity type and containing from 5 atomic % to 40 atomic % hydrogen, wherein x is $0 \leq x \leq 1$;

a base contact located within said base contact opening and comprising a third crystalline doped $Si_xGe_{1-x}$ material of said first conductivity type and containing from 5 atomic % to 40 atomic % hydrogen, wherein x is $0 \leq x \leq 1$;

a first electrode located on an exposed surface of the emitter contact;

a second electrode located on an exposed surface of the collector contact; and a third electrode located on an exposed surface of the base contact.

18. The bipolar junction transistor of claim 17 further comprising a first doped region of said second conductivity type located within said top crystalline semiconductor material and located beneath said emitter contact and a second doped region of said second conductivity type located within said top crystalline semiconductor material and located beneath said collector contact.

19. The bipolar junction transistor of claim 17, wherein a portion of each of said first, second and third electrodes directly contacts an exposed surface of said passivation layer.

20. The bipolar junction transistor of claim 17, wherein no portion of each of said first, second and third electrodes directly contacts an exposed surface of said passivation layer, and wherein a non-crystalline doped $Si_xGe_{1-x}$ material of said second conductivity type is positioned between said first and second electrodes and said exposed surface of said passivation layer, and wherein a non-crystalline doped $Si_xGe_{1-x}$ material of said first conductivity type is positioned between said third electrode and said exposed surface of said passivation layer.

21. The bipolar junction transistor of claim 20, wherein each of said first, second and third electrodes has an outer edge that is vertically coincident with an outer edge of said non-crystalline doped $Si_xGe_{1-x}$ material and wherein an inner edge of said non-crystalline doped $Si_xGe_{1-x}$ material is in direct contact with a portion of said crystalline doped $Si_xGe_{1-x}$ material.

* * * * *